United States Patent
Jang et al.

(10) Patent No.: US 10,553,147 B2
(45) Date of Patent: Feb. 4, 2020

(54) GATE DRIVER AND DISPLAY DEVICE HAVING THE SAME

(71) Applicant: LG DISPLAY CO., LTD., Seoul (KR)

(72) Inventors: Hyunguk Jang, Seoul (KR); Seungho Heo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 138 days.

(21) Appl. No.: 15/718,804

(22) Filed: Sep. 28, 2017

(65) Prior Publication Data
US 2018/0096644 A1 Apr. 5, 2018

(30) Foreign Application Priority Data
Sep. 30, 2016 (KR) .................. 10-2016-0127128

(51) Int. Cl.
*G11C 19/00* (2006.01)
*G09G 3/20* (2006.01)
*G11C 19/28* (2006.01)
*G09G 3/36* (2006.01)

(52) U.S. Cl.
CPC ............. *G09G 3/2092* (2013.01); *G09G 3/20* (2013.01); *G11C 19/28* (2013.01); *G09G 3/3677* (2013.01); *G09G 2300/0408* (2013.01); *G09G 2300/08* (2013.01); *G09G 2300/0871* (2013.01); *G09G 2310/0267* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 2009/0167668 A1* | 7/2009 | Kim | ..................... | G09G 3/3677 345/100 |
| 2010/0110047 A1* | 5/2010 | Yoon | .................... | G09G 3/3677 345/204 |
| 2010/0156858 A1* | 6/2010 | Moon | .................... | G11C 19/28 345/204 |
| 2010/0158187 A1* | 6/2010 | Moon | .................. | G09G 3/3266 377/76 |
| 2011/0018845 A1* | 1/2011 | Mizunaga | ............ | G09G 3/3677 345/204 |
| 2012/0044133 A1* | 2/2012 | Nakamizo | ............... | G11C 19/28 345/100 |
| 2013/0169609 A1* | 7/2013 | Son | ........................ | G11C 19/28 345/209 |
| 2014/0055333 A1* | 2/2014 | Lin | ...................... | G09G 3/3611 345/100 |
| 2014/0076684 A1* | 3/2014 | Specht | ................... | B65G 39/02 193/37 |
| 2014/0152629 A1* | 6/2014 | So | .......................... | G11C 19/28 345/205 |

(Continued)

*Primary Examiner* — Tuan T Lam
(74) *Attorney, Agent, or Firm* — Seed IP Law Group LLP

(57) ABSTRACT

A display device comprises a pixel array, a timing controller, a Q node control signal input line, and a shift register. In the pixel array, data lines and gate lines are defined, and pixels are arranged in a matrix. The timing controller outputs a start signal and a first reset signal. The Q node control signal input line receives the start signal and the first reset signal. The shift register comprises a plurality of stages connected as a cascade, and sequentially supplies dummy gate pulses or gate pulses applied to the gate lines.

16 Claims, 5 Drawing Sheets

(56) References Cited

U.S. PATENT DOCUMENTS

| | | | | |
|---|---|---|---|---|
| 2014/0346520 A1* | 11/2014 | Kim | .................... | H01L 27/1255 257/59 |
| 2015/0213762 A1* | 7/2015 | Xia | ...................... | G09G 3/3266 345/215 |
| 2015/0325181 A1* | 11/2015 | Wang | ................... | G09G 3/3677 377/64 |
| 2016/0155422 A1* | 6/2016 | Sun | ......................... | G09G 3/20 345/213 |
| 2016/0187917 A1* | 6/2016 | Lou | ..................... | G09G 3/2096 345/213 |
| 2017/0076684 A1* | 3/2017 | Kim | ..................... | G09G 3/3677 |
| 2017/0316751 A1* | 11/2017 | Wang | .................. | G09G 3/3685 |

\* cited by examiner

DSTG1

STG(i) or DSTG2

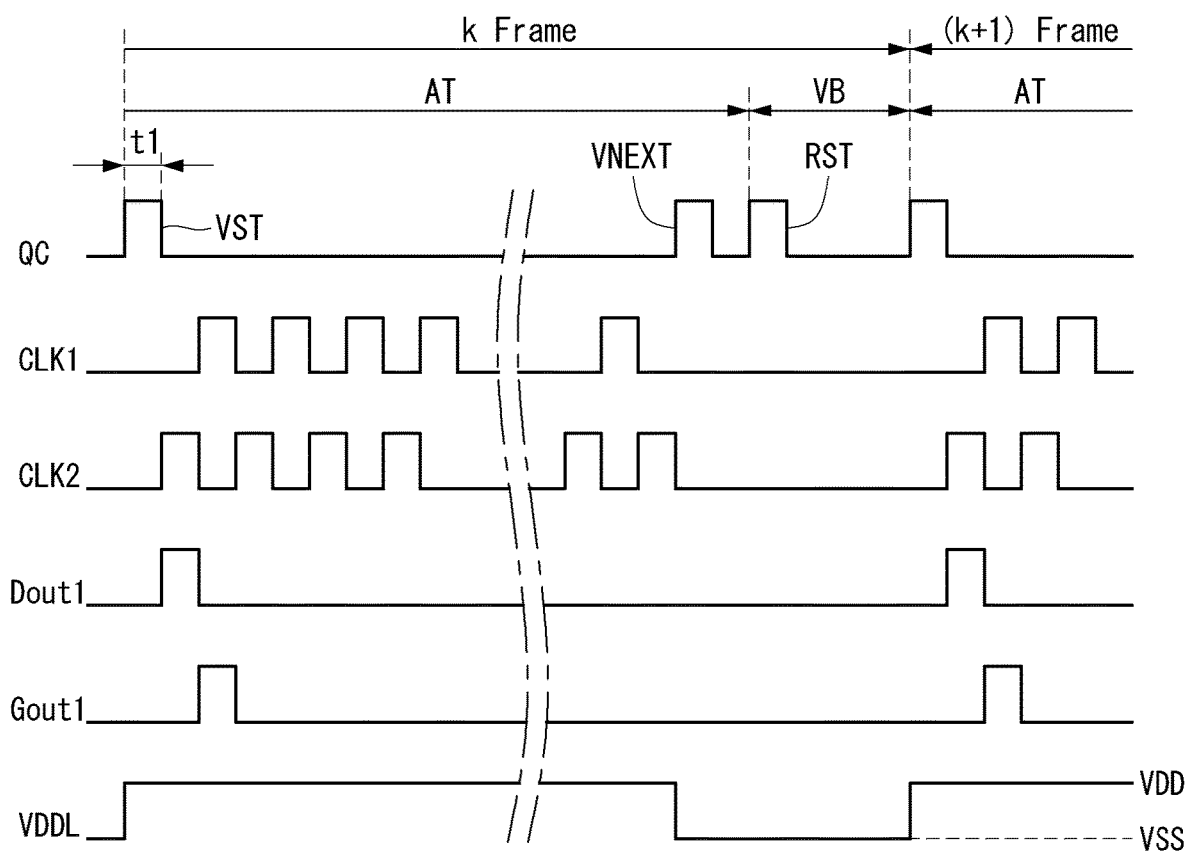

GATE DRIVER AND DISPLAY DEVICE HAVING THE SAME

CROSS-REFERENCE TO RELATED APPLICATION

This application claims the priority benefit of Korean Patent Application No. 10-2016-0127128 filed on Sep. 30, 2016, which is hereby incorporated herein by reference in its entirety for all purposes as if fully set forth herein.

BACKGROUND

Technical Field

The present disclosure relates to a gate driver that allows for reducing the bezel around a display panel and a display device having the same.

Description of the Related Art

In a display device, data lines and gate lines are arranged to intersect at right angles, and pixels are arranged in a matrix. Video data voltages to be displayed are applied to the data lines, and gate pulses are sequentially supplied to the gate lines. Pixels on display lines to which gate pulses are supplied are supplied with video data voltages, and video data is displayed as all the display lines are sequentially scanned by the gate pulses.

A gate driver for supplying gate pulses to the gate lines on the display device typically comprises a plurality of gate integrated circuits (hereinafter, "IC"). Each gate drive IC basically comprises a shift register because it has to sequentially output gate pulses, and may comprise circuits and output buffers, for adjusting the output voltage of the shift register according to the driving characteristics of the display panel.

In the display device, the gate driver which generates gate pulses, i.e., scan signals, may be implemented in the form of a gate-in-panel (hereinafter, "GIP") consisting of a combination of thin-film transistors, in the bezel area of the display panel where no image is displayed. The GIP-type gate driver has a number of stages corresponding to the number of gate lines, and the stages output gate pulses to the corresponding gate lines on a one-to-one basis.

A GIP-type shift register can reduce the manufacturing costs of drive circuits because it can take the place of a gate drive IC. However, the increasing complexity of GIP circuits often increases the number of driving signals applied to the GIP circuits. Applying more driving signals to GIP requires more signal lines for applying each of these driving signals. This results in an increase in the size of the bezel around the display panel.

BRIEF SUMMARY

An example embodiment of the present disclosure provides a display device comprising a pixel array, a timing controller, a Q node control signal input line, and a shift register. In the pixel array, data lines and gate lines are defined, and pixels are arranged in a matrix. The timing controller outputs a start signal and a first reset signal. The Q node control signal input line receives the start signal and the first reset signal. The shift register comprises a plurality of stages connected as a cascade, and sequentially supplies dummy gate pulses or gate pulses applied to the gate lines. Each of the stages comprises a pull-up transistor and first and second transistors. The pull-up transistor charges the output using a clock signal applied to the drain, in response to a Q node voltage. The first transistor charges the Q node with a high-potential voltage, in response to the start signal applied from the Q node control signal input line or the voltage at the output of the preceding stage. The second transistor discharges the Q node to a low-potential voltage, in response to the first reset signal applied from the Q node control signal input line or the voltage at the output of the succeeding stage. A high-potential voltage input line from which the high-potential voltage is applied maintains the low-potential voltage while the first reset signal is being applied.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 6 is a timing diagram showing driving signals and outputs of a shift register.

DETAILED DESCRIPTION

Figure 1:
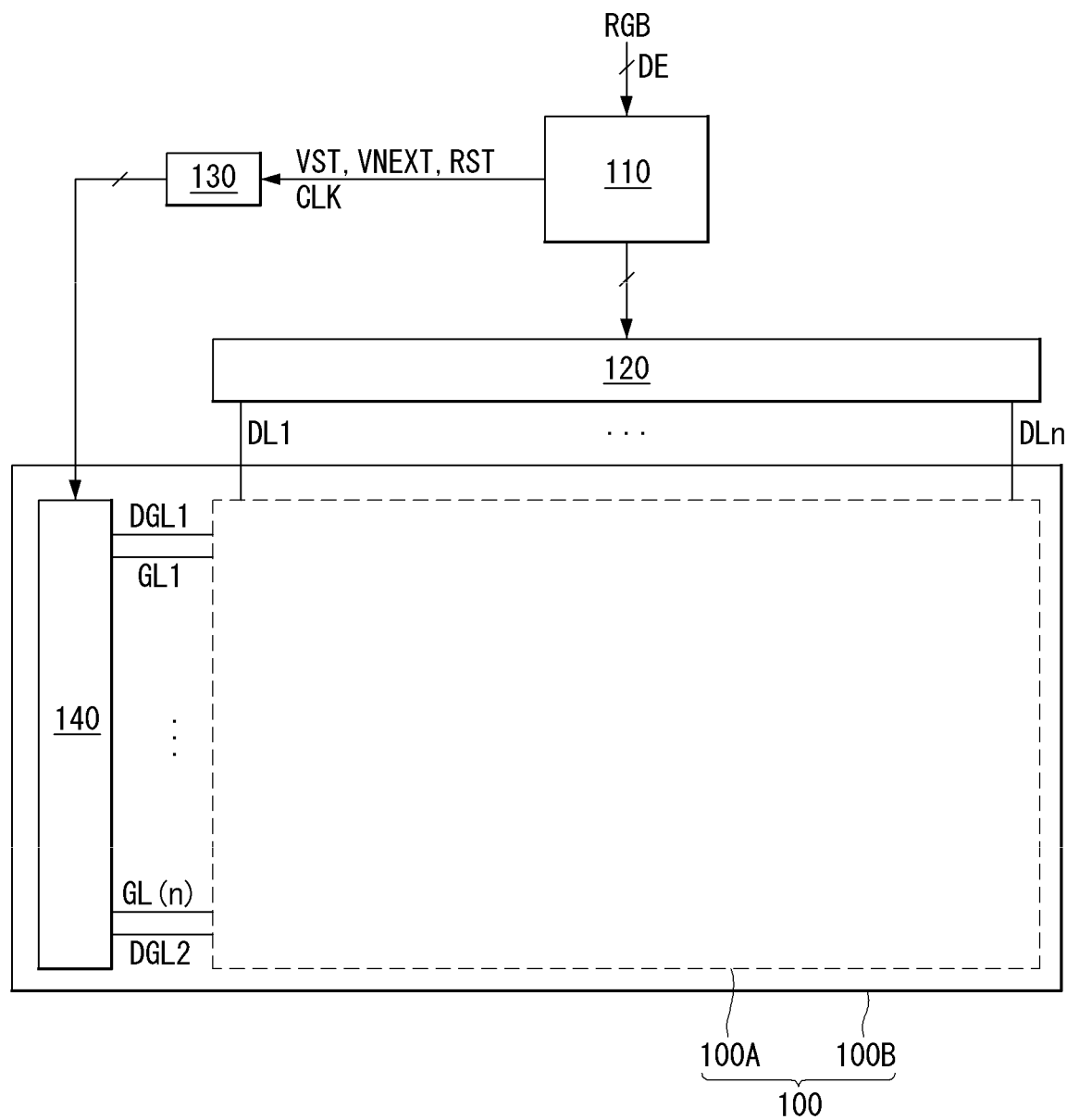
FIG. 1 is a block diagram of a display device according to the present disclosure.

Hereinafter, example embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. The terms and names of elements used herein are chosen for ease of description and may differ from names used in actual products.

In a shift register of the present disclosure, switching elements may be implemented as n-type or p-type MOSFET (metal oxide semiconductor field effect transistor) transistors. It should be noted that, although the following example embodiments are illustrated with example n-type transistors, the present disclosure is not limited to them. A transistor is a three-electrode device with gate, source, and drain. The source is an electrode that provides carriers to the transistor. The carriers in the transistor flow from the source. The drain is an electrode where the carriers leave the transistor. That is, carriers in a MOSFET flow from the source to the drain. In the case of the n-type MOSFET (NMOS), the carriers are electrons, and thus the source voltage is lower than the drain voltage so that the electrons flow from the source to the drain. In the n-type MOSFET, since the electrons flow from the source to the drain, current flows from the drain to the source. In the case of the p-type MOSFET (PMOS), the carriers are holes, and thus the source voltage is higher than the drain voltage so that the holes flow from the source to the drain. In the p-type MOSFET, since the holes flow from the source to the drain, current flows from the source to the drain. It should be noted that the source and drain of a MOSFET are not fixed in position. For example, the source and drain of the MOSFET are interchangeable depending on the applied voltage. In the following example embodiment, the disclosure should not be limited by the source and drain of a transistor.

"Turn-on voltage," as used in this specification, refers to the operating voltage of a transistor. In this specification, an example embodiment is described with respect to an n-type transistor, and thus the turn-on voltage is illustrated as a high-potential voltage.

FIG. 1 is a block diagram of a display device according to an example embodiment of the present disclosure. Referring to FIG. 1, a display device of this disclosure comprises a display panel 100, a timing controller 110, a data driver 120, and a gate driver 130 and 140.

The display panel 100 comprises a pixel array 100A where data lines DL and gate lines GL are defined and pixels are arranged, and a non-display area 100B around the pixel array 100A where various signal lines or pads are formed. For the display panel 100, a liquid crystal display (LCD), an organic light-emitting diode display (OLED), an electrophoresis display (EPD), etc. may be used.

The timing controller 110 receives timing signals, such as a vertical synchronization signal Vsync, a horizontal synchronization signal Hsync, a data enable signal DE, and a dot clock DCLK, through a low-voltage differential signaling LVDS or transition-minimized differential signaling TMDS interface receiver circuit connected to a video board. On the basis of an input timing signal, the timing controller 110 generates data timing control signals DDC for controlling the operation timing of the data driver 120 and gate timing control signals GDC for controlling the operation timing of the gate driver 130 and 140, or specifically level shifter 130 and shift register 140.

The data timing control signal comprises a source start pulse SSP, a source sampling clock SSC, a polarity control signal POL, a source output enable signal SOE, etc. The source start pulse SSP controls the shift start timing of the data driver 120. The source sampling clock SSC is a clock signal that controls the timing of data sampling in the data driver 120 with respect to the rising edge or falling edge.

The gate timing control signal comprises a start pulse VST, a first reset signal VNEXT, a second reset signal RST, a gate clock CLK, etc. The start pulse VST is input into a first stage STG1 of a shift register 140 to control the shift start timing. The first reset signal VNEXT is a signal for discharging a Q node in the last stage of the shift register 140. The second reset signal RST is a signal for charging Q nodes in all stages of the shift register 140, except the first stage DSTG1, within a vertical blanking interval VB. The gate clock CLK is level-shifted by a level shifter 130 and then input into the shift register 140.

The data driver 120 receives digital video data RGB and a data timing control signal DDC from the timing controller 110. The data driver 120 converts digital video data RGB into gamma voltages in response to the data timing control signal DDC to produce data voltages and supply them through the data lines DL on the display panel 100.

The gate driver 130 and 140 includes the level shifter 130 and the shift register 140. The level shifter 130 is formed on a printed circuit board (not shown) that is connected to the display panel 100 in the form of ICs. The level shifter 130 level-shifts the start signal VST, the first reset signal VNEXT, the second reset signal RST, the gate clock CLK, etc., and then supplies them to the shift register 140. The shift register 140 comprises a plurality of stages connected as a cascade. The stages comprise first and second dummy stages DSTG1 and DSTG2 that output dummy gate pulses and first to nth stages STG1 to STGn that output gate pulses.

Figure 2:
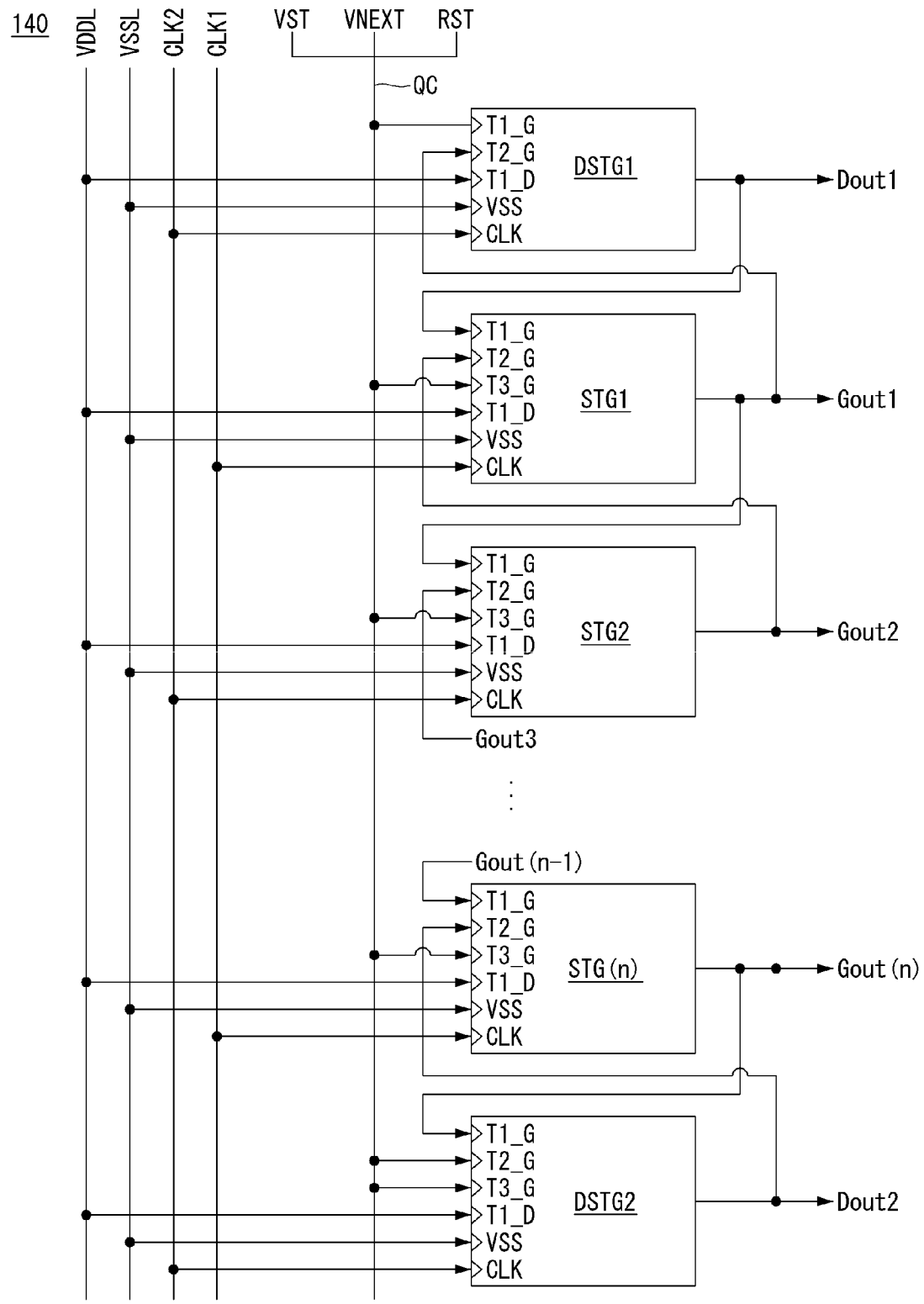
FIG. 2 is a view showing stages according to the present disclosure.

FIG. 2 is a view showing a shift register according to the present disclosure.

Referring to FIG. 2, the shift register 140 is formed with a combination of a plurality of thin-film transistors (hereinafter, "TFTs") in the non-display area 100B of the display panel 100, using the gate-in-panel (hereinafter, "GIP") technology, and sequentially outputs gate pulses. To this end, the shift register 140 comprises a plurality of stages DSTG1, STG1 to STGn, and DSTG2 connected as a cascade.

The shift register 140 receives gate timing control signals through a plurality of signal lines.

A high-potential voltage input line VDDL is connected to gate electrodes T1_G of first transistors disposed in the stages DSTG1, STG1 to STGn, and DSTG2. As shown in FIG. 6, the high-potential voltage input line VDDL maintains a low-potential voltage VSS in a period during which the first and second reset signals VNEXT and RST are applied.

A low-potential voltage input line VSSL is connected to source electrodes of transistors for discharging the voltage at the charge control Q nodes or discharge control QB nodes of the stages DSTG1, STG1 to STGn, and DSTG2.

A Q node control signal input line QC receives the start signal VST, first reset signal VNEXT, and second reset signal RST whose voltage levels are shifted by the level shifter 130. The start signal VST and the first and second reset signals VNEXT and RST are applied at a turn-on voltage in different periods in one frame.

Figure 3:
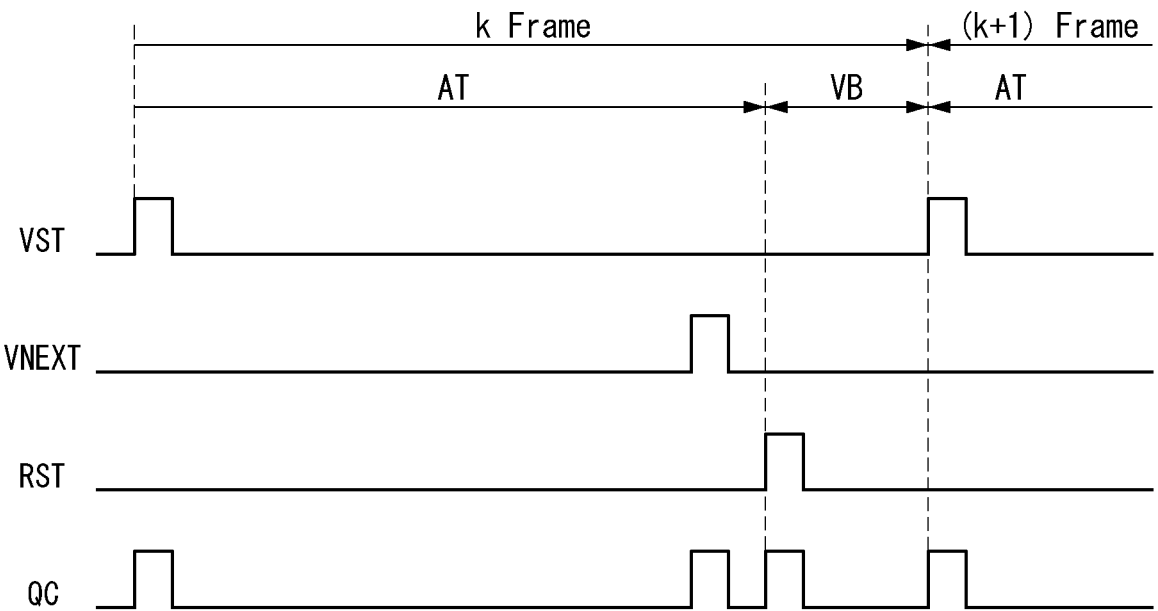
FIG. 3 is a timing diagram showing timings of signals applied to a Q node control signal input line.

FIG. 3 is a view showing a voltage change on the Q node control signal input line.

Timings of signals applied to the Q node control signal input line QC will be described below.

Referring to FIG. 3, a frame is divided into an active period AT and a vertical blanking interval VB. The active period AT is the time period taken to write 1 frame of data on all pixels in the display area 100A. The vertical blanking interval VB comprises a vertical sync time VS, a vertical front porch FP, and a vertical back porch BP based on the VESA (Video Electronics Standards Association) standards.

The start signal VST is applied at an initial phase of a frame. The first reset signal VNEXT is applied before the end of the active period AT, and the second reset signal RST is applied within the vertical blanking interval VB. Accordingly, the Q node control signal input line QC maintains the turn-on voltage in periods during which the start signal VST, first reset signal VNEXT, and second reset signal RST are applied. In the shift register 140 according to the present disclosure, signals lines for applying the start signal VST and the first and second reset signals VNEXT and RST may be integrated into a single signal line, thereby reducing the size of the bezel area where the shift register 140 is disposed.

Since the start signal VST and the first and second reset signals VNEXT and RST control different transistors, simply integrating signal lines may cause the transistors to operate at unwanted timings. This may lead to a malfunction of the shift register. Thus, the shift register 140 requires a different configuration than the conventional ones.

Figure 4:
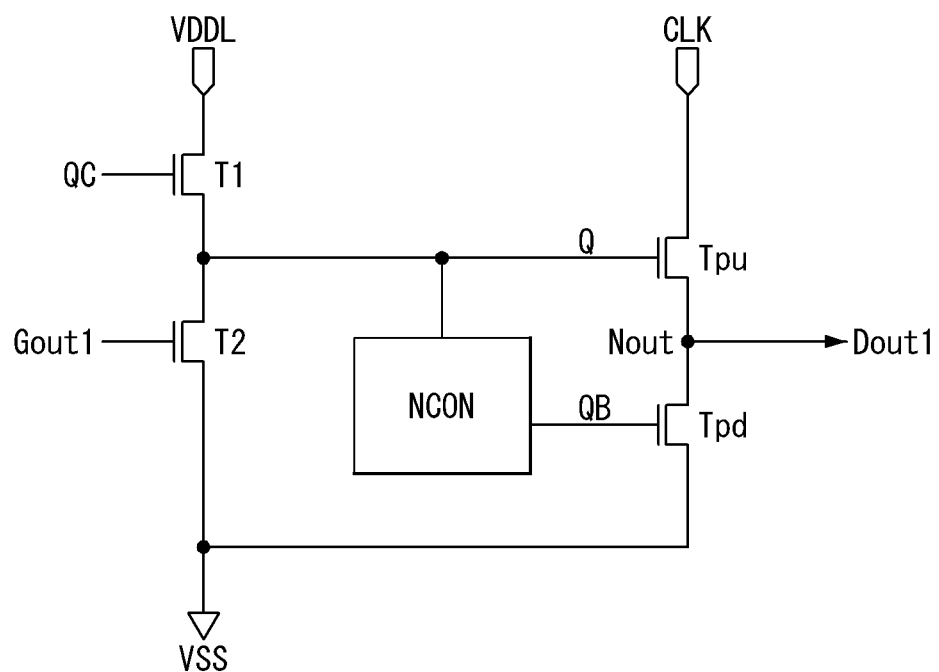
FIG. 4 is a view showing the first dummy stage of FIG. 2.
Figure 5:
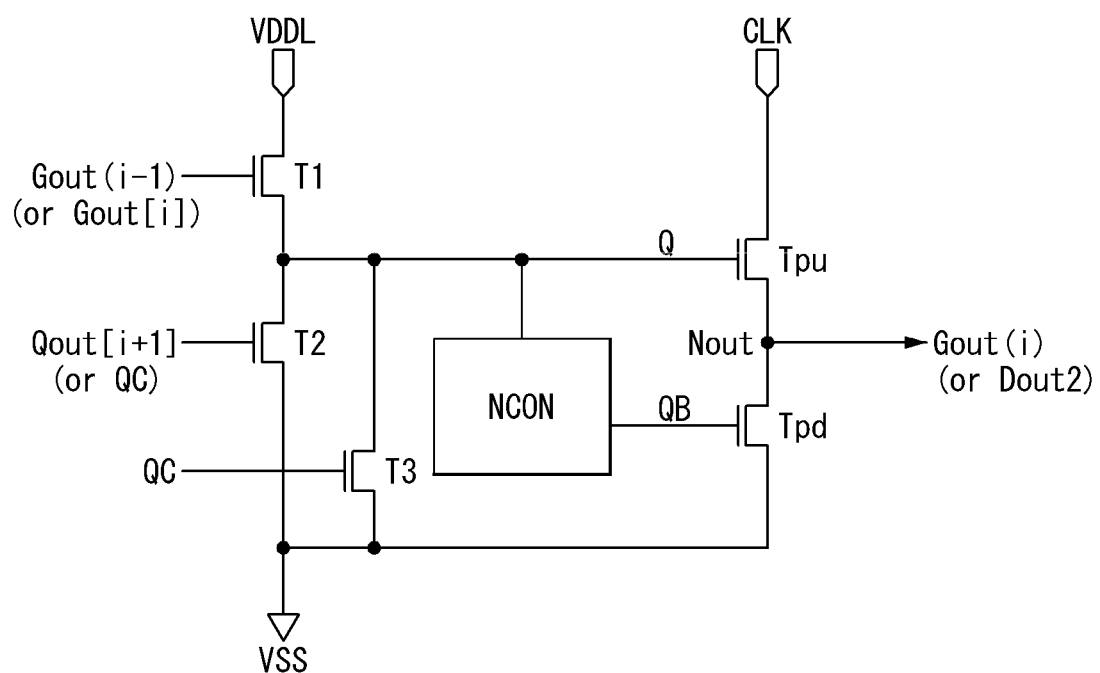
FIG. 5 is a view showing the first to nth stages or the second dummy stage of FIG. 2.

FIG. 4 is a view showing a configuration of the first dummy stage of FIG. 2. FIG. 5 is a view showing a configuration of the first to nth stages and second dummy stage of FIG. 2.

Referring to FIG. 2 and FIGS. 4 and 5, the shift register 140 comprises a plurality of stages connected as a cascade. In the description herein, "preceding stage" refers to a stage positioned before/above a reference stage. For example, a preceding stage indicates either the first dummy stage DSTG1 or one of the first stage STG1 to (i−1)th stage STG(i−1), with respect to the ith stage STGi (i is a natural number where 1<i≤n). That is, the first dummy stage DSTG1 is the preceding stage of the first stage STG1. "Succeeding stage" refers to a stage positioned after/below the reference stage. For example, a succeeding stage indicates either one of the [i+1]th stage STG(i+1) to nth stage STGn or the second dummy stage DSTG2, with respect to the ith stage STGi (i is a natural number where 1≤i<n). That is, the second dummy stage DSTG 2 is the succeeding stage of the nth stage STGn.

The shift register 140 comprises the first and second dummy stages DSTG1 and DSTG2 and the first to nth stages STG1 to STGn. The first and second dummy stages DSTG1 and DSTG2 output first and second dummy gate pulses Dout1 and Dout2, respectively. The first to nth stages STG1 to STGn sequentially output first to nth gate pulses Gout[1] to Gout[n], respectively.

The stages DSTG1, STG1 to STGn, and DSTG2 each start operating as the respective Q node is pre-charged when the first transistor T1 turns on. Also, the stages DSTG1, STG1 to STGn, and DSTG2 are each reset as the respective Q node is discharged when the second transistor T2 turns on. Within the vertical blanking interval of each frame, the first to nth stages STG1 to STGn and the second dummy stage DSTG2 are reset as the Q node is discharged when the third transistor T3 turns on.

The first transistor T1 of the first dummy stage DSTG1 turns on in response to a start signal VST applied from the Q node control signal line QC, and the first transistors T1 of the first to nth stages STG1 to STGn and second dummy stage DSTG2 turn on in response to the voltage at the output of the preceding stage.

The second transistors T2 of the first dummy stage DSTG1 and first to nth stages STG1 to STGn turn on in response to the voltage at the output of the succeeding stage, and the second transistor T2 of the second dummy stage DSTG2 turns on in response to a first reset signal VNEXT applied from the Q node control signal input line QC.

The third transistors T3 of the first to nth stages STG1 to STGn and second dummy stage DSTG2 turn on simultaneously in response to a second reset signal RST applied from the Q node control signal input line QC.

Referring to FIGS. 4 and 5, detailed configurations of each stage will be described below.

Referring to FIGS. 4 and 5, the first dummy stage DSTG1 comprises a pull-up transistor Tpu, a pull-down transistor Tpd, a node controller NCON, and first and second transistors T1 and T2.

The pull-up transistor Tpu comprises a gate electrode connected to the Q node, a drain electrode connected to the input of a gate clock CLK, and a source electrode connected to an output Npout.

The pull-down transistor Tpd comprises a gate electrode connected to the QB node, a drain electrode connected to the output Nout, and a source electrode connected to a gate-low voltage input.

The node controller NCON controls the charging or discharging of the Q node and QB node. The node controller NCON may be formed with a combination of one or more transistors, and may use any configuration.

The first transistor T1 of the first dummy stage DSTG1 comprises a gate electrode connected to the Q node control signal input line QC, a drain electrode connected to the high-potential voltage input line VDDL, and a source electrode connected to the Q node. The first transistor T1 of the first dummy stage DSTG1 electrically connects the high-potential input line VDDL and the Q node, in response to the voltage on the Q node control signal input line QC. The high-potential voltage input line VDDL supplies a high-potential voltage VDD while the start signal VST is being applied, and, as a result, the Q node is charged with the high-potential voltage VDD.

The second transistor T2 of the first dummy stage DSTG1 comprises a gate electrode that receives a first gate pulse Gout1 output from the first stage STG1, a drain electrode connected to the Q node, and a source electrode connected to the low-potential voltage input line VSSL. The second transistor T2 of the first dummy stage DSTG1 discharges the Q node to the low-potential voltage VSS in response to the first gate pulse Gout1.

Referring to FIG. 5, the ith stage STGi and the second dummy stage DSTG1 each comprise a pull-up transistor Tpu, a pull-down transistor Tpd, a node controller NCON1, and first to third transistors T1 to T3. Regarding the components in FIG. 5, a detailed description will be omitted if they are substantially the same as those in the first dummy stage DSTG1 of FIG. 4.

The ith stage STGi refers to a stage that outputs an ith gate pulse Gouti. The gate electrodes of the first transistors T1 of the ith stage STGi and second dummy stage DSTG2 are connected to the output of the preceding stage. The first dummy stage DSTG1 is the preceding stage of the first stage STG1.

The second transistor T2 of the ith stage STGi comprises a gate electrode that receives a gate pulse output from the succeeding stage, a drain electrode connected to the Q node, and a source electrode connected to the low-potential voltage input line VSSL. The second transistor T2 of the second dummy stage DSTG2 comprises a gate electrode connected to the Q node control signal input line QC, a drain electrode connected to the Q node, and a source electrode connected to the low-potential voltage input line VSSL. That is, the second transistors T2 of all stages DSTG1 and STG1 to STGn of the shift register 140, except the second dummy stage DSTG2, which is the last stage, operate in response to the voltage at the output Nout of the succeeding stage.

The third transistors T3 of the ith stage STGi and second dummy stage DSTG2 comprise a gate electrode connected to the Q node control signal input line QC, a drain electrode connected to the Q node, and a source electrode connected to the low-potential voltage input line VSSL.

FIG. 6 is a view showing timings of driving signals of the shift register according to the present disclosure.

An operation of the shift register 140 according to the present disclosure will be described below with reference to FIGS. 2 to 6.

At the start of a kth frame, the Q node control signal input line QC applies the start signal VST during a first period t1. The first transistor T1 of the first dummy stage DSTG1 pre-charges the Q node in response to a start signal VST.

When a gate clock, e.g., CLK2, is input into the drain electrode of the pull-up transistor Tpu while the Q node is in the pre-charged state, the voltage at the drain electrode of the pull-up transistor Tpu rises, thus allowing the Q node to be bootstrapped. As the Q node is bootstrapped, the potential difference between the gate and source of the pull-up transistor Tpu increases, and as a result, the pull-up transistor Tpu turns on when the voltage difference between the gate and source reaches a threshold voltage. The turned-on pull-up transistor Tpu charges the output Nout by using the gate clock CLK. As a result, the output Nout of the first dummy stage DSTG1 outputs a first dummy gate pulse Dout1.

The first dummy gate pulse Dout1 is applied to the first transistor T1 of the first stage STG1. The first transistor T1 of the first stage STG1 pre-charges the Q node in response to the first dummy gate pulse Dout1, and the first stage STG1 charges the output Nout by receiving a first gate clock CLK1. Clock signal Clk1 is an inversion of clock signal CLK2. In this way, the first to nth stages STG1 to STGn and the second dummy stage DSTG2 charge the output Nout in the same way as the first dummy stage DSTG1, and output a gate pulse or a dummy gate pulse.

The first gate pulse Gout1 output from the first stage STG1 is applied to the gate electrode of the second transistor T2 of the first dummy stage DSTG1. The second transistor T2 of the first dummy stage DSTG1 discharges the Q node to the low-potential voltage VSS. Likewise, a second gate pulse Gout2 and second dummy gate pulse Dout2 respectively output from the second stage STG2 and second dummy stage DSTG2 are applied to the gate electrode of the second transistor T2 of the preceding stage.

The second transistor T2 of the second dummy stage DSTG2, which is the last stage, discharges the Q node in response to the first reset signal VNEXT applied from the Q node control signal input line QC.

The high-potential voltage input line VDDL applies the low-potential voltage VSS while the first reset signal VNEXT is being applied. Since the Q node control signal input line QC is connected to the gate electrode of the first transistor T1 of the first dummy stage DSTG1 as well, the Q node of the first dummy stage DSTG1 is connected to the high-potential voltage input line VDDL when the first transistor T1 of the first dummy stage DSTG1 is turned on by the first reset signal VNEXT. If the high-potential voltage input line VDDL maintains the high-potential voltage VDD, the Q node of the first dummy stage DSTG1 is charged during a second period t2, thus causing the shift register 140 to malfunction.

To prevent the shift register 140 from malfunctioning, i.e., operating at an unwanted time, the high-potential voltage input line VDDL applies the low-potential voltage VSS while the first reset signal VNEXT is being applied.

Within the vertical blanking period VB after the end of the active period AT, the Q node control signal input line QC applies a second reset signal RST. The third transistors T3 of the first to nth stages STG1 to STGn and second dummy stage DSTG2 discharge the Q node in response to the second reset signal RST applied from the Q node control signal input line QC. That is, all the stages STG1 to STGn and DSTG2 except the first dummy stage DSTG1 are reset by the second reset signal RST.

The first dummy stage DSTG1 has no third transistor T3. If the first dummy stage DSTG1 has a third transistor T3, both the first transistor T1 and third transistor T3 of the first dummy stage DSTG1 will be connected to the Q node control signal input line QC. That is, in the first dummy stage DSTG1, both the first transistor T1 charging the Q node and the third transistor T3 discharging the Q node would turn on simultaneously, thus keeping the shift register 140 from operating properly.

The shift register 140 according to the present disclosure has no problem of causing the first transistor T1 and the third transistor T3 to turn on simultaneously since the first dummy stage DSTG1, which is the foremost stage, has no third transistor T3.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a pixel array where data lines and gate lines are defined and pixels are arranged in a matrix;
a timing controller that outputs a start signal and a first reset signal;
a Q node control signal input line that receives the start signal and the first reset signal; and
a shift register comprising a plurality of stages connected as a cascade and sequentially supplying dummy gate pulses or gate pulses applied to the gate lines, wherein each of the stages comprises:
a pull-up transistor that charges an output node connected to one of a source node or a drain node of the pull-up transistor using a clock signal applied to another one of the drain node or the source node of the pull-up transistor in response to a voltage at a Q node;
a first transistor that charges the Q node with a high-potential voltage in response to the start signal applied from the Q node control signal input line or a voltage at an output node of a preceding stage; and
a second transistor that discharges the Q node to a low-potential voltage in response to the first reset signal applied from the Q node control signal input line or a voltage at an output node of a succeeding stage, a high-potential voltage input line from which the high-potential voltage is applied being shifted to a low-potential voltage while the first reset signal is being applied.

2. The display device of claim 1, wherein a frame is divided into an active period and a subsequent vertical blanking interval,
wherein the start signal is applied at an initial phase of the active period, and the first reset signal is applied at an end of the active period.

3. The display device of claim 1, wherein the shift register includes:
first to nth stages respectively connected to n pixel lines (n being a natural number) on the pixel array; and
a first dummy stage preceding the first stage,
wherein the first dummy stage outputs a first dummy gate pulse in response to the start signal, and the first stage outputs a first gate pulse in response to the first dummy gate pulse.

4. The display device of claim 3, further comprising a second dummy stage succeeding the nth stage,
wherein the second transistors of the first to nth stages each discharge the Q node thereof in response to the voltage at the output node of the succeeding stage, and the second transistor of the second dummy stage discharges the Q node thereof in response to the first reset signal.

5. The display device of claim 4, wherein a frame is divided into an active period and a subsequent vertical blanking interval and the Q node control signal input line further receives a second reset signal from the timing controller within the vertical blanking interval, and
wherein the first to nth stages and the second dummy stage each further comprise a third transistor that discharges the Q node thereof to the low-potential voltage, in response to the second reset signal applied from the Q node control signal input line.

6. The display device of claim 5, wherein the high-potential voltage input line maintains the low-potential voltage while the second reset signal is being applied.

7. A gate driver for a display device, comprising:
a Q node control signal input line that receives a start signal and a first reset signal; and
a shift register comprising a plurality of stages connected as a cascade and sequentially supplying dummy gate pulses or gate pulses applied to the gate lines, wherein each of the stages comprises:
a pull-up transistor that charges an output node connected to one of a source node or a drain node of the pull-up transistor using a clock signal applied to another one of the drain node or the source node of the pull-up transistor in response to a voltage at a Q node;
a first transistor that charges the Q node with a high-potential voltage in response to the start signal applied from the Q node control signal input line or a voltage at an output node of a preceding stage; and
a second transistor that discharges the Q node to a low-potential voltage in response to the first reset signal applied from the Q node control signal input line or a voltage at an output node of a succeeding stage, a high-potential voltage input line from which the high-potential voltage is applied being shifted to a low-potential voltage while the first reset signal is being applied.

8. The gate driver of claim 7, wherein a timing frame of the display device includes an active period and a subsequent vertical blanking interval,
wherein the start signal is applied at a beginning of the active period, and the first reset signal is applied about an end of the active period.

9. The gate driver of claim 7, wherein the shift register includes:
first to nth stages respectively connected to n pixel lines (n being a natural number) on a pixel array of the display device; and
a first dummy stage preceding the first stage,
wherein the first dummy stage outputs a first dummy gate pulse in response to the start signal, and the first stage outputs a first gate pulse in response to the first dummy gate pulse.

10. The gate driver of claim 9, further comprising a second dummy stage succeeding the nth stage,
wherein the second transistors of the first to nth stages each discharge the Q node thereof in response to the voltage at the output node of the succeeding stage, and the second transistor of the second dummy stage discharges the Q node thereof in response to the first reset signal.

11. The gate driver of claim 10, wherein a timing frame of the display device includes an active period and a subsequent vertical blanking interval and the Q node control signal input line further receives a second reset signal within the vertical blanking interval, and
wherein the first to nth stages and the second dummy stage each further include a third transistor that discharges the Q node thereof to the low-potential voltage, in response to the second reset signal applied from the Q node control signal input line.

12. The gate driver of claim 11, wherein the high-potential voltage input line maintains the low-potential voltage while the second reset signal is being applied.

13. A method of driving a pixel array of a display device comprising:
charging a first dummy stage using a start signal and a first clock signal subsequent to the start signal to generate a first dummy output;
charging a first driving stage using the first dummy output and a second clock signal to generate a first driving output, the second clock signal being an inversion of the first clock signal;
discharging the first dummy stage using the first driving output;
charging a second driving stage using the first driving output and the first clock signal to generate a second driving output;
discharging the first driving stage using the second driving output;
charging a second dummy stage using a driving output of a last driving stage to generate a second dummy output;
discharging the last driving stage using the second dummy output; and
discharging the second dummy state using a first reset signal, the first reset signal being provided from a same signal line as the start signal.

14. The method of claim 13, further comprising:
resetting the first driving stage, the second driving stage, the last driving stage and the second dummy stage using a second reset signal, the second reset signal being provided from the same signal line.

15. The method of claim 13, wherein a timing frame of the display device includes an active period and a subsequent vertical blanking interval and the start signal is applied at an beginning of the active period, the first reset signal is applied about an end of the active period and the second reset signal is applied within the vertical blanking interval.

16. The method of claim 13, further comprising:
shifting a high voltage potential applied to the first dummy stage to a low voltage potential while the first reset signal is applied.

* * * * *